(12) United States Patent
Smith et al.

(10) Patent No.: US 10,916,637 B2
(45) Date of Patent: Feb. 9, 2021

(54) METHOD OF FORMING GATE SPACER FOR NANOWIRE FET DEVICE

(71) Applicant: TOKYO ELECTRON LIMITED, Tokyo (JP)

(72) Inventors: Jeffrey Smith, Clifton Park, NY (US); Anton deVilliers, Clifton Park, NY (US)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/435,411

(22) Filed: Jun. 7, 2019

(65) Prior Publication Data

US 2019/0296128 A1     Sep. 26, 2019

Related U.S. Application Data

(63) Continuation of application No. 15/812,263, filed on Nov. 14, 2017, now Pat. No. 10,347,742.

(Continued)

(51) Int. Cl.
*H01L 29/00* (2006.01)
*H01L 29/66* (2006.01)
(Continued)

(52) U.S. Cl.
CPC ........ *H01L 29/66553* (2013.01); *B82Y 10/00* (2013.01); *H01L 21/02532* (2013.01); *H01L 21/02603* (2013.01); *H01L 21/28123* (2013.01); *H01L 29/0673* (2013.01); *H01L 29/0847* (2013.01); *H01L 29/401* (2013.01); *H01L 29/42392* (2013.01); *H01L 29/66439* (2013.01); *H01L 29/66545* (2013.01);
(Continued)

(58) Field of Classification Search
CPC .......................... H01L 29/401; H01L 29/0847
See application file for complete search history.

(56) References Cited

U.S. PATENT DOCUMENTS 8,288,823 B2    10/2012  Ernst et al.
8,637,359 B2    1/2014   Chang et al.
(Continued)

OTHER PUBLICATIONS

International Search Report and Written Opinion dated Feb. 21, 2018 in PCT/US2017/061539, 10 pages.

*Primary Examiner* — Caridad Everhart
*Assistant Examiner* — Ankush K Singal
(74) *Attorney, Agent, or Firm* — Oblon, McClelland, Maier & Neustadt, L.L.P.

(57) ABSTRACT

A method of forming a gate-all-around semiconductor device, includes providing a substrate having a layered fin structure thereon. The layered fin structure includes a channel portion and a sacrificial portion each extending along a length of the layered fin structure, wherein the layered fin structure being covered with replacement gate material. A dummy gate is formed on the replacement gate material over the layered fin structure, wherein the dummy gate having a critical dimension which extends along the length of the layered fin structure. The method further includes forming a gate structure directly under the dummy gate, the gate structure including a metal gate region and gate spacers provided on opposing sides of the metal gate region, wherein a total critical dimension of the gate structure is equal to the critical dimension of the dummy gate.

12 Claims, 16 Drawing Sheets

Related U.S. Application Data

(60) Provisional application No. 62/421,528, filed on Nov. 14, 2016.

(51) Int. Cl.

| | | |
|---|---|---|
| *H01L 29/775* | (2006.01) | |
| *B82Y 10/00* | (2011.01) | |
| *H01L 29/40* | (2006.01) | |
| *H01L 29/786* | (2006.01) | |
| *H01L 29/08* | (2006.01) | |
| *H01L 21/02* | (2006.01) | |
| *H01L 21/28* | (2006.01) | |
| *H01L 29/06* | (2006.01) | |
| *H01L 29/423* | (2006.01) | |

(52) U.S. Cl.
CPC .. *H01L 29/66742* (2013.01); *H01L 29/66772* (2013.01); *H01L 29/775* (2013.01); *H01L 29/7869* (2013.01); *H01L 29/78618* (2013.01); *H01L 29/78651* (2013.01); *H01L 29/78654* (2013.01); *H01L 29/78684* (2013.01); *H01L 29/78696* (2013.01)

(56) References Cited

U.S. PATENT DOCUMENTS

| | | |
|---|---|---|
| 8,969,965 B2 | 3/2015 | Chang et al. |
| 9,349,868 B1 | 5/2016 | Balakrishnan et al. |
| 9,490,340 B2 * | 11/2016 | Koh .................. H01L 29/0673 |
| 9,502,518 B2 | 11/2016 | Qing Liu et al. |
| 9,508,719 B2 | 11/2016 | Chen et al. |
| 9,721,970 B2 | 8/2017 | Balakrishnan et al. |
| 9,748,352 B2 | 8/2017 | Liu et al. |
| 9,853,101 B2 * | 12/2017 | Peng .................. H01L 29/42392 |
| 9,887,264 B2 | 2/2018 | Chu |
| 2009/0085119 A1 | 4/2009 | Ernst et al. |
| 2012/0313170 A1 | 12/2012 | Chang et al. |
| 2013/0341704 A1 | 12/2013 | Rachmady |
| 2014/0021538 A1 | 1/2014 | Bangsaruntip |
| 2014/0117464 A1 | 5/2014 | Chang et al. |
| 2014/0335673 A1 | 11/2014 | Kim |
| 2015/0287826 A1 * | 10/2015 | Cheng .................. H01L 29/16 257/20 |
| 2015/0333167 A1 * | 11/2015 | Leobandung ..... H01L 21/02532 257/347 |
| 2015/0372104 A1 | 12/2015 | Liu et al. |
| 2016/0111513 A1 | 4/2016 | Liu et al. |
| 2016/0148935 A1 * | 5/2016 | Chen .................. H01L 21/02532 257/369 |
| 2016/0365411 A1 | 12/2016 | Yeh |
| 2016/0365426 A1 | 12/2016 | Ching |
| 2016/0380003 A1 | 12/2016 | Balakrishnan et al. |
| 2017/0005188 A1 | 1/2017 | Cheng |
| 2017/0053998 A1 * | 2/2017 | Kim .................. H01L 21/764 |
| 2017/0076946 A1 | 3/2017 | Chen et al. |
| 2017/0104062 A1 | 4/2017 | Bi |
| 2017/0179275 A1 | 6/2017 | Li |
| 2017/0236932 A1 | 8/2017 | Balakrishnan et al. |
| 2017/0330955 A1 | 11/2017 | Rahhal-Orabi |

\* cited by examiner

METHOD OF FORMING GATE SPACER FOR NANOWIRE FET DEVICE

CROSS REFERENCE TO RELATED APPLICATIONS

This application is a continuation of U.S. patent application Ser. No. 15/812,263, filed Nov. 14, 2017, which is based on, and claims the benefit of priority to, U.S. provisional application No. 62/421,528, filed on Nov. 14, 2016, the entire contents of which are incorporated herein by reference.

BACKGROUND OF THE INVENTION

Field of the Disclosure

This disclosure relates to a method of manufacturing a semiconductor device such as an integrated circuit and transistors and transistor components for an integrated circuit.

Discussion of Background Art

Manufacturing of a semiconductor device (especially on the microscopic scale) involves various fabrication processes such as film-forming depositions, etch mask creation, patterning, material etching and removal, as well as doping treatments, that are performed repeatedly to form desired semiconductor device elements on a substrate. Historically, with microfabrication, transistors have been created in one plane, with wiring/metallization formed above such plane, and have thus been characterized as two-dimensional (2D) circuits or 2D fabrication. Scaling efforts have greatly increased the number of transistors per unit area in 2D circuits, yet scaling efforts are running into greater challenges as scaling enters single digit nanometer semiconductor device fabrication nodes. Semiconductor device fabricators have expressed a desire for three-dimensional (3D) semiconductor devices in which transistors are stacked on top of each other. There remains a continuing need to provide scaling of improved and high performing semiconductor devices, as well as a need for corresponding manufacturing processes.

SUMMARY

One object of the present disclosure is to provide 3D semiconductor devices and methods which improve electrical performance and reliability. These and other objects are provided by embodiments disclosed herein including the following numbered example aspects.

(1) A method of forming a gate-all-around semiconductor device, including: providing a substrate having a layered fin structure thereon, the layered fin structure including a channel portion and a sacrificial portion each extending along a length of the layered fin structure, wherein the layered fin structure being covered with replacement gate material. A dummy gate is formed on the replacement gate material over the layered fin structure, wherein the dummy gate having a critical dimension which extends along the length of the layered fin structure. The method further includes forming a gate structure directly under the dummy gate, the gate structure including a metal gate region and gate spacers provided on opposing sides of the metal gate region, wherein a total critical dimension of the gate structure is equal to the critical dimension of the dummy gate.

(2) The method of aspect 1, wherein the providing a substrate includes providing a layered fin structure having an Si channel portion and an SiGe sacrificial portion.

(3) The method of aspect 2, wherein the Si channel portion includes a plurality of Si layers and the SiGe sacrificial portion includes a plurality of SiGe layers, the Si layers being alternately stacked with the SiGe layers.

(4) The method of aspect 1, wherein the forming a dummy gate includes forming a layer of dummy gate material on the replacement gate material, and removing a portion of the dummy gate material such that a remaining portion of the dummy gate material has opposing edges defining the dummy gate having the critical dimension.

(5) The method of aspect 4, wherein the forming a gate structure includes using the dummy gate as a mask to anisotropically etch the replacement gate material such that opposing sidewall surfaces of the replacement gate material are aligned with the opposing edges of the dummy gate.

(6) The method of aspect 5, wherein the forming a gate structure further includes isotropically etching a lateral recess into each of the opposing sidewall surfaces of the replacement gate material, and filling the lateral recess with gate spacer material.

(7) The method of aspect 6, wherein the filling the lateral recess with gate spacer material includes covering the substrate with the gate spacer material, and using the dummy gate as a mask to anisotropically etch the gate spacer material, such that opposing sidewall surfaces of the gate spacer material are aligned with the opposing edges of the dummy gate.

(8) The method of aspect 6, wherein the isotropically etching includes etching to a lateral depth equal to the intended thickness of the gate spacer.

(9) The method of aspect 6, wherein the lateral depth defines a critical dimension of the metal gate region of the gate structure.

(10) The method of aspect 6, wherein the forming a gate structure includes using the dummy gate as a mask to anisotropically etch the layered fin structure such that opposing sidewall surfaces of the sacrificial portion and channel portion are aligned with the opposing edges of the dummy gate.

(11) The method of aspect 10, wherein the forming a gate structure further includes isotropically etching a lateral recess into each of the opposing sidewall surfaces of the sacrificial portion; and filling the lateral recess with gate spacer material.

(12) The method of aspect 11, wherein the isotropically etching a lateral recess into each of the opposing sidewall surfaces of the sacrificial portion includes etching to a lateral depth no greater than an intended thickness of the gate spacers.

(13) The method of aspect 11, wherein the filling the lateral recess with gate spacer material includes covering the substrate with the gate spacer material; and using the dummy gate as a mask to anisotropically etch the gate spacer material, such that opposing sidewall surfaces of the gate spacer material are aligned with the opposing edges of the dummy gate.

(14) The method of aspect 12, wherein the intended gate spacer thickness is 30-100 angstroms.

(15) The method of aspect 12, further including removing the dummy gate, and forming source-drain regions adjacent to the gate spacers. A remaining portion of the sacrificial portion is released, and a multilayer gate structure is formed in the metal gate region.

(16) Another aspect includes a gate all around nanowire FET device including at least one nanowire having opposing ends. A gate structure including a metal gate region surrounding a middle portion of the at least one nanowire, and gate spacers surrounding remaining end portions of the nanowire such that opposing ends of the gate spacers are aligned with respective opposing ends of the nanowire to form opposing sidewalls of the gate structure. Source-drain regions provided on the opposing sidewalls of the gate structure.

(17) The gate all around nanowire FET device of aspect 16, wherein the at least one nanowire includes a plurality of vertically stacked nanowires, wherein opposing ends of each nanowire are aligned with the opposing sidewalls of the gate structure.

(18). The gate all around nanowire FET device of aspect 16, wherein the at least one nanowire is made of Si.

(19) The gate all around nanowire FET device of aspect 16, wherein the at least one nanowire is made of SiGe.

(20). The semiconductor device according to aspect 16, wherein each of the gate spacers has a thickness of 30-100 angstroms.

BRIEF DESCRIPTION OF THE DRAWINGS

The accompanying drawings, which are incorporated in and constitute a part of the specification, illustrate one or more embodiments and, together with the description, explain these embodiments. The accompanying drawings have not necessarily been drawn to scale. Any values dimensions illustrated in the accompanying figures are for illustration purposes only and may or may not represent actual or preferred values or dimensions. Where applicable, some or all features may not be illustrated to assist in the description of underlying features. In the drawings.

DETAILED DESCRIPTION

Techniques herein pertain to device fabrication using gate-all-around processing incorporating nanowires (or nanoslabs or nanosheets) in a nanowire FET (field effect transistor) or through a stacked complimentary FET device. Gate-all-around (GAA) identifies a FET device in which a metal gate is physically wrapped around a silicon or silicon/germanium wire and is a further extension of the tri-gate process where the gate is wrapped around a silicon or silicon/germanium fin. With finFETs, the gate wraps around on three of four sides, while with GAA FET devices, the gate wraps around all of a given channel (whether the given channel has a rectangular or circular cross-section). One type of a GAA FET device is a nanowire FET.

With tri-gate or finFET processing, the formation of the gate spacer is relatively simple because the fin runs continuously through a gate and source drain bar regions. With the advent of nanowire processing for gate-all-around fabrication, the formation of the gate spacer becomes more challenging in that the gate spacer should be formed to surround end portions of the nanowire. Further, with multi-channel devices, the gate spacer should be formed in between multiple wires that are placed overtop one another and thus needs to "fill in" the area in between the wires in the vertical as well as the horizontal orientation.

Figure 1:
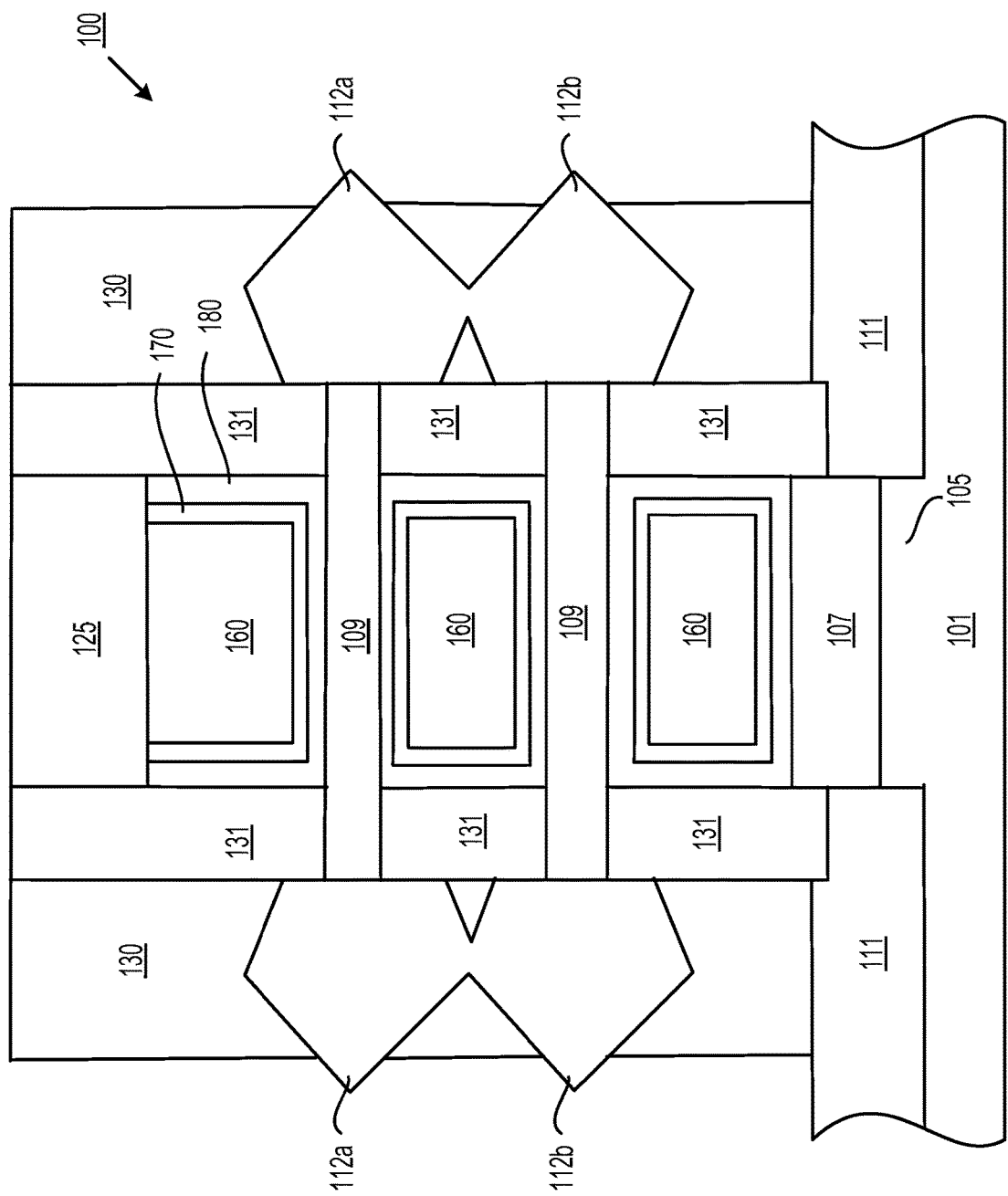
FIG. 1 is a schematic representation of a cross-section view of a semiconductor device having gate spacers according to certain aspects of the present disclosure.

FIG. 1 is a schematic representation of cross-section of a multi-channel FET device having gate spacers according to embodiments of the disclosure. Device 100 includes a substrate 101 having thereon a gate structure and source-drain regions coupled to the gate structure to form a nanowire FET device. In the embodiment shown, the gate structure includes nanowires 109 that function as a current channel for the device 100 (i.e. multi-channel device). The gate structure includes a metal gate region made up of metal fill 160, work function material (WFM) 170, and high-k dielectric material 180 surrounding the nanowires 109 in a GAA configuration. A gate cap 125 covers gate metal fill 160, WFM 170 and high-K material 180. Gate spacers 131 are provided on outer sides of the metal gate region to complete the gate structure. As seen, gate spacers 131 are wrapped around opposing end regions of the nanowires 109.

The S-D regions of the device 100 include S-D contacts 112a and 112b formed on either side of the gate structure adjacent to ends of nanowires 109 and outer sidewalls of the gate spacers 131. S-D contacts 112a and 112b are surrounded by S-D metal 130 forming the S-D electrode (also referred as S-D bar) in the S-D region. In FIG. 1, the S-D contacts 112a and 112b are connected or merged with each other and metal 130 provides a single S-D electrode for both S-D contacts 112a and 112b. Alternatively or in addition, in some implementations, the S-D regions 112a and 112b may be separated to provide separate contacts for each nanowire 109. A remaining bulk fin portion of the substrate 101, sacrificial material 104 and shallow trench isolation (STI) oxide coating 111 is are also shown in the device 100.

One of the process integration issues associated with gate-all-around and nanowire processing is with the formation of the gate spacer 131. The gate spacer 131 should be deposited within regions separating nanowires 109 such that nanowires 109 protrude or extend through the gate spacer 131. The gate spacer 131 should also be defined to high precision (i.e. thickness uniformity, critical dimension control). For example, the gate spacer 131, also called low-k spacer, is what separates the metal gate from the metal contacts to the source and drain of the device. For area scaling of the standard cell size, the size of the low-k or gate spacer needs to be kept very small, often on the order of 50 A (5.0 nm) or less. The gate spacer should have low dielectric such as 4.0 so that such as small spacer can control the capacitance between the metal gate and the metal contacts. If the gate spacer 131 at any point decreases in width below a certain point, there will be capacitance issues. Since the gate spacer 131 is defined during the replacement gate module before the gate has been metalized; if the size of the gate spacer is too large, then it will take away available width from the source and drain area. For approaches where the gate spacer 131 is defined through laterally recessing the replacement gate structure, any over-recessing (and hence larger gate spacer) will cause the eventual metal gate to be smaller than intended. Techniques herein may propose a cyclic etch process using a tool such as CERTAS, manufactured by Tokyo Electron Ltd., which can be set to a very low etch rate and the etch is defined by a fixed number of cycles in order to get this level or precision. Conventional techniques do not have a desirable process to make continuous gate spacers around stacked, protruding nanowires where the thickness of the gate spacer can be maintained to a high degree of control. For example, typical gate spacers in tri-gate processes are formed simply through some type of ALD or CVD deposition. This process does not extend well to nanowire gate-all-around processing given that the wires are independent and protrude through the gate spacer material. Thus a new process integration approach is needed in order to form the gate spacer around the silicon or silicon/germanium wires.

Figure 2:
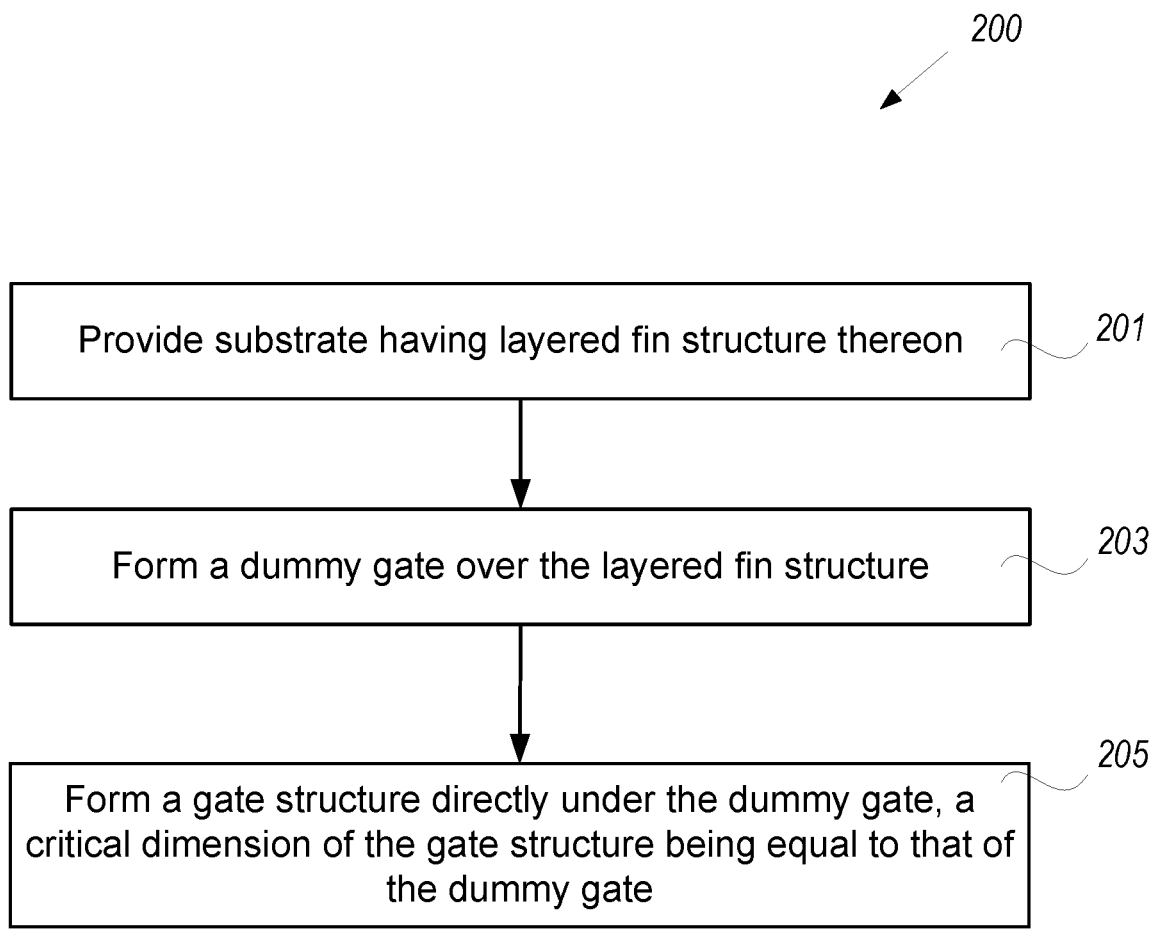
FIG. 2 is a flow chart of a manufacturing process for forming a semiconductor device having gate spacers according to certain aspects of the present disclosure.

FIG. 2 shows a process for manufacturing a gate all around device having a gate spacer according to some embodiments. As seen in step 201, the process includes providing a substrate having a layered fin structure thereon. The layered fin structure includes a channel portion and a sacrificial portion each extending along a length of the layered fin structure, and the layered fin structure is covered with replacement gate material. In step 203, a dummy gate is formed on the replacement gate material over the layered fin structure. The dummy gate has opposing edges that define a critical dimension of the dummy gate which extends along the length of the layered fin structure. The dummy gate functions as a temporary pattern that exhibits selectivity to other materials used in the nanowire formation and replacement gate processing materials such as Si, SiGe, polysilicon, SiN, SiOx, SiOCx(N)y, etc.).

Once a dummy gate is formed over the layered fin structure, a gate structure is formed directly under the dummy gate as shown by step 205. The gate structure includes a metal gate region and gate spacers provided on opposing sides of the metal gate region. The metal gate region is defined by inner sidewalls of the gate spacers and will include a physical gate such as the layered gate discussed in FIG. 1. Outer sidewalls of the gate spacers are aligned with edges of the dummy gate; thus, a total critical dimension (CD) of the gate structure is equal to the CD of the dummy gate.

In forming the gate structure, a sacrificial portion (e.g., silicon or silicon germanium) of the fin is recessed selective to other materials by using isotropic etching such as with a vapor-phase etch systems. This sacrificial portion of the fin can be recessed a lateral distance equal to a desired thickness of the gate spacer. Thus the gate spacer CD can be defined by a well-controlled isotropic etch process. Once the sacrificial portion of the fin is recessed within the replacement gate, the gate spacer material can then be deposited. An anisotropic etch step is then used to remove the gate spacer material from areas outside the intended gate spacer region (defined by the edges of the dummy gate placed above the replacement gate). Thus, the gate spacer material will fill in the recessed edges of the fins and will form a consistent gate spacer where the nanowires forming a current channel will protrude through the gate spacer.

The method of FIG. 2 enables the formation of the gate spacer within the recessed areas that define protruding nanowires. The gate spacer CD control is obtained through an isotropic etch process where the edges are defined by the dummy gate edge on one end and the recess depth of sacrificial material (either the silicon or silicon/germanium) on the other end. This method provides a "fill-in" process to define the gate spacer which is much more well-controlled compared to other processing methods to produce a continuous gate spacer around protruding wires.

FIGS. 3A-3M illustrate structures at various stages in an example process for manufacturing a device having the structure shown in FIG. 1. FIG. 2 will be described in more detail with reference to FIGS. 3A-3M. As known in the art, nanowire or nanosheets can be formed from a "fin" structure of alternating semiconductor materials, such as Si and SiGe. Silicon nanowire formation can be accomplished through isotropic etching of the SiGe in the fin, and formation of a gate spacer material which terminates at the end of the silicon wires on either end of the gate structure. Similarly, SiGe nanowires can be formed by selectively etching Si in the fin relative to SiGe. Techniques herein are applicable to both Si and SiGe nanowires or nanosheets or nanoslabs, as well as to other similar semiconductor structures. For convenience in explaining embodiments herein, the description in FIGS. 1, 2 and 3A-3M is directed to a process where silicon nanowires are produced. Thus, FIGS. 2 and 3A-3M disclose an integration and hardware method to form a gate structure of a semiconductor device.

Figure 3A:
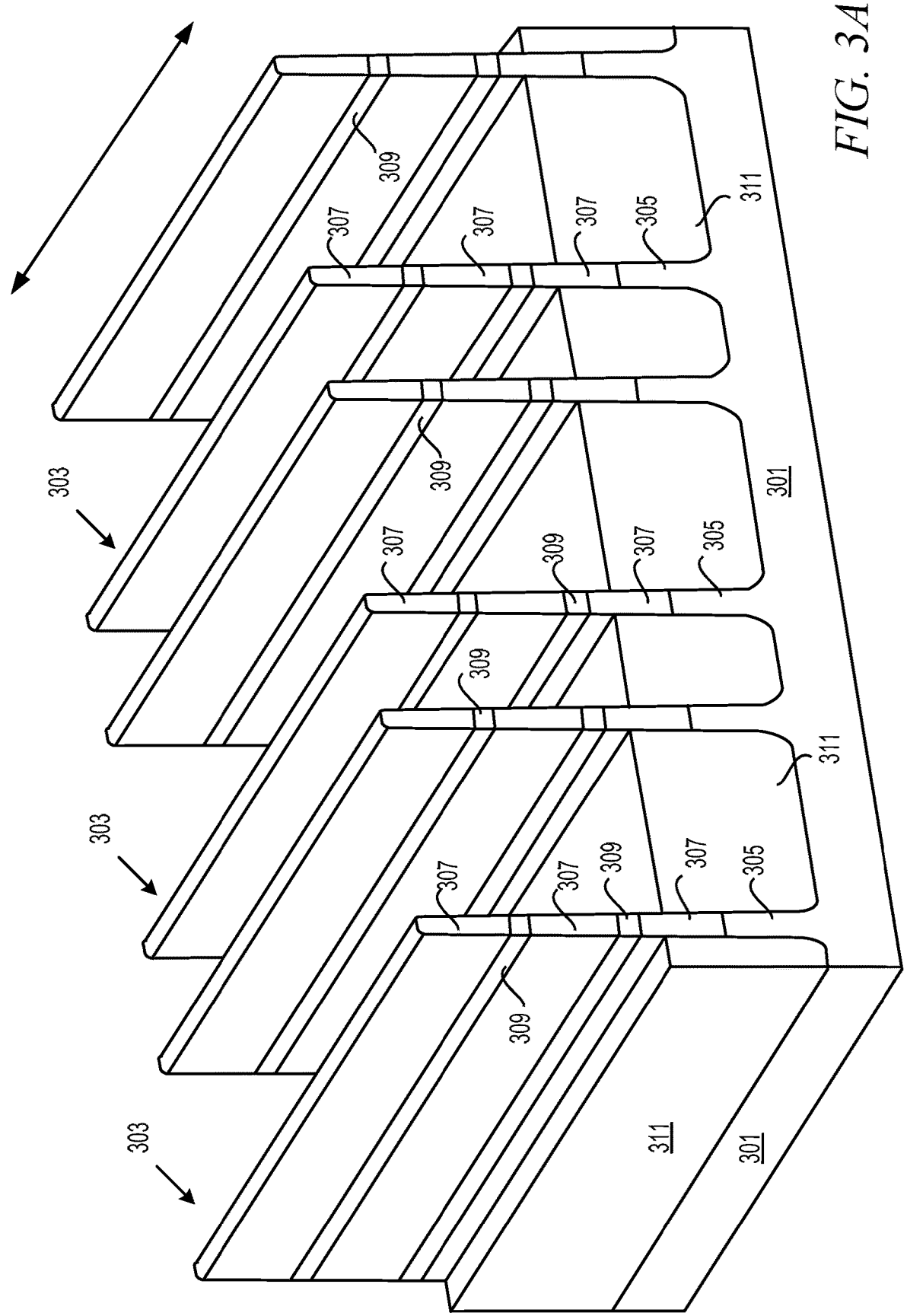
FIG. 3A is a perspective cross-section view of an example starting structure for manufacturing the device of FIG. 1 according to certain aspects of the present disclosure.

The method 200 of FIG. 2 may start with a semiconductor structure such as the example structure shown in FIG. 3A.

The structure shows an array of multilayer fins at an intermediate stage in device processing. The structure includes a substrate 301 having the array of fins 303 thereon, with a length of the fins extending along the arrow as shown. Each fin 303 includes a bulk fin 305, SiGe layers 307 serving as a sacrificial portion, and Si nanowires 309 serving as the channel portion. The SiGe 307 will be removed to release the nanowires 309 later in the process. Bulk fin 305 is formed of silicon and remains after release of the nanowires 309. In the structure of FIG. 3A, a shallow trench isolation (STI) oxide 311 is provided at a base of the fin structure.

Figure 3B:
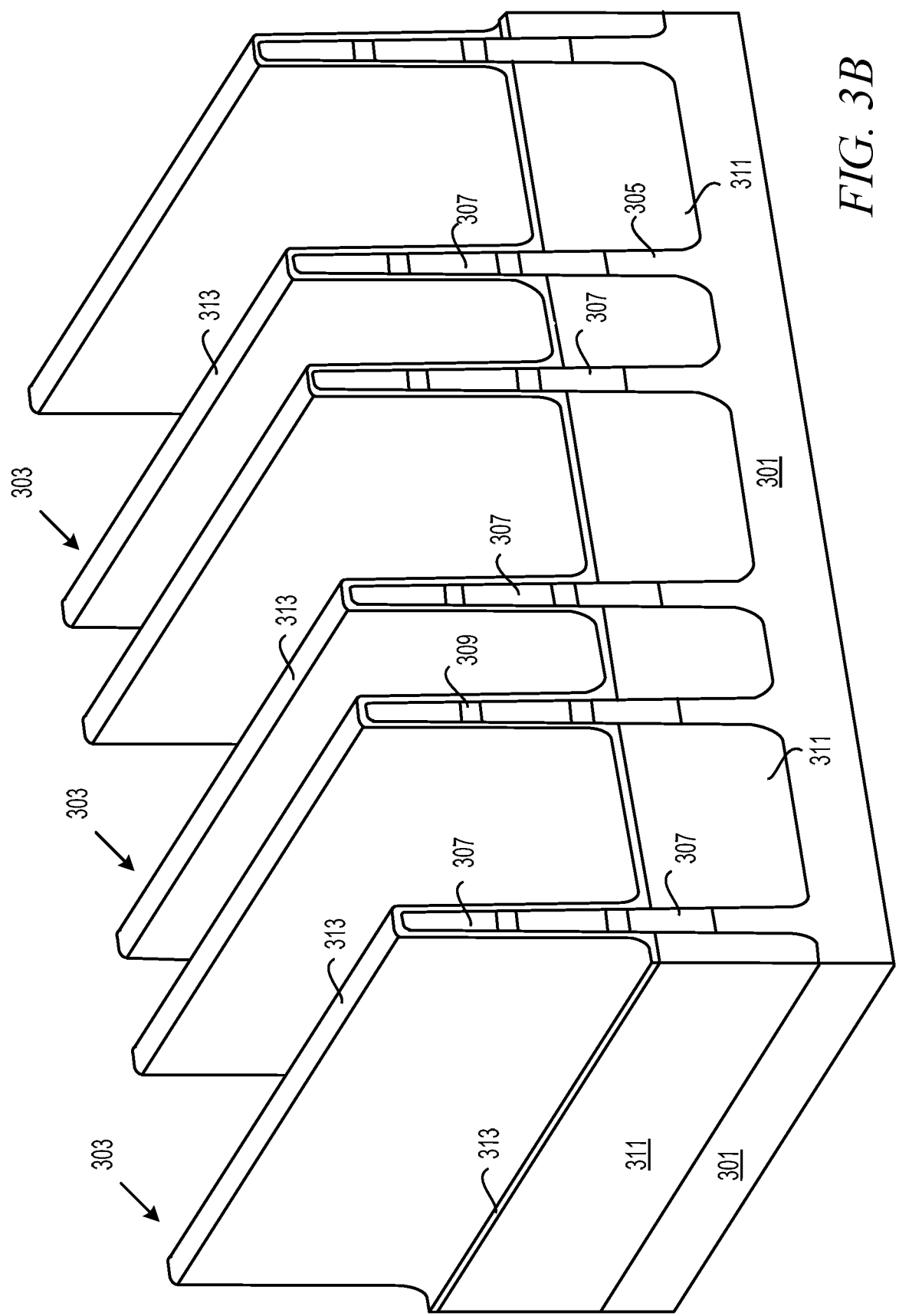
FIG. 3B is a perspective cross-section view of an example intermediate structure in a process of manufacturing the device of FIG. 1 according to certain aspects of the present disclosure.
Figure 3C:
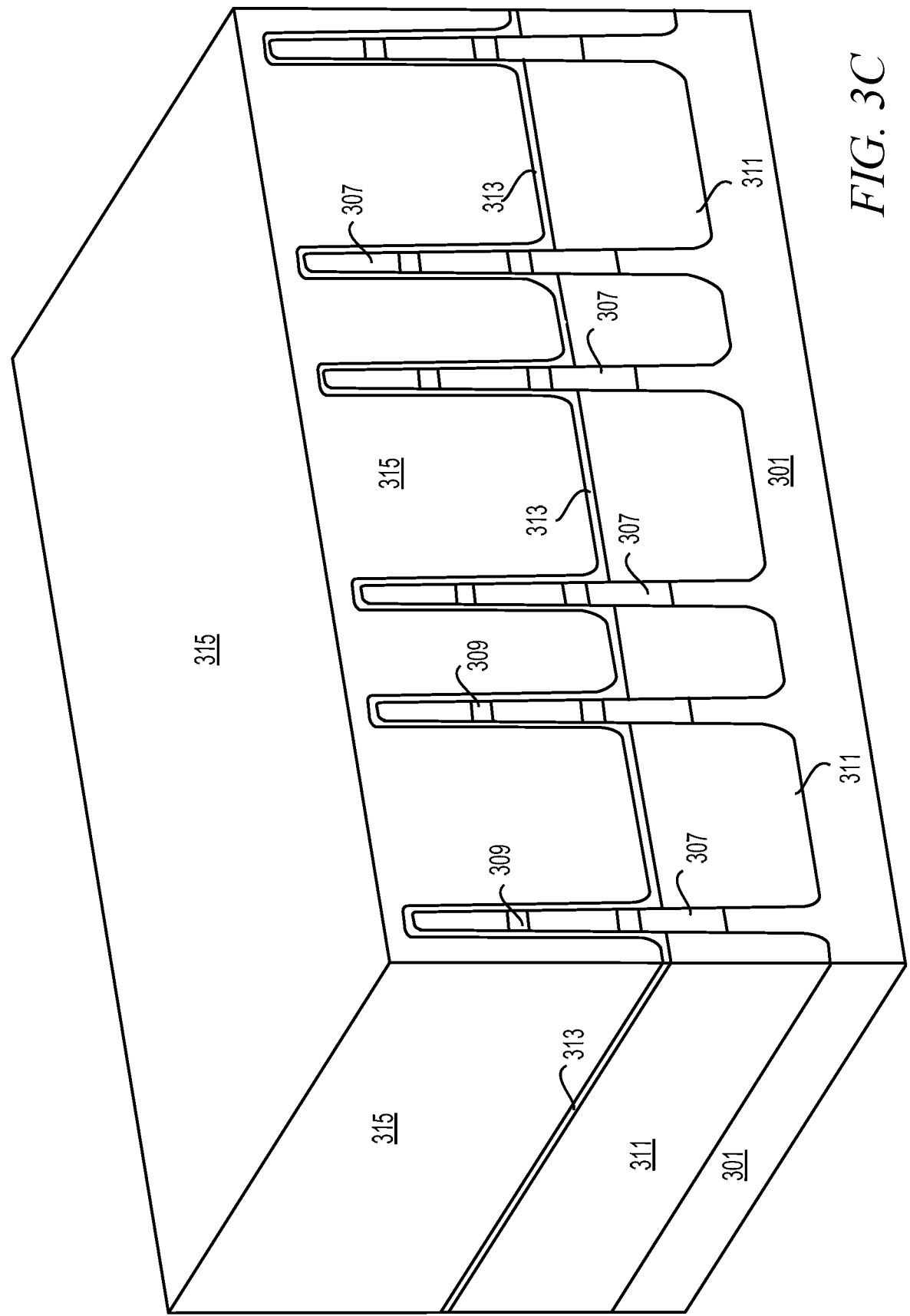
FIG. 3C is a perspective cross-section view of an example intermediate structure in a process of manufacturing the device of FIG. 1 according to certain aspects of the present disclosure.

As seen in FIG. 3B, a protective liner 313 is deposited overtop the Si/SiGe fin structure to protect the fin from subsequent etch steps as discussed below. The protective liner 313 can be deposited, for example, as thermal SiOx, ALD SiOx, or various of MeOx (metal oxide) or SiN-based materials. Replacement gate material 315, such as polysilicon, is then deposited on the substrate 301 over the fin array and liner 313 as shown in FIG. 3C. The replacement gate material 315 may be planarized, or deposited to cause the substrate to be planarized such as by filling spaces and resulting in an over burden of material. The structure of FIG. 3C provides the starting structure of step 201 in FIG. 2.

Figure 3D:
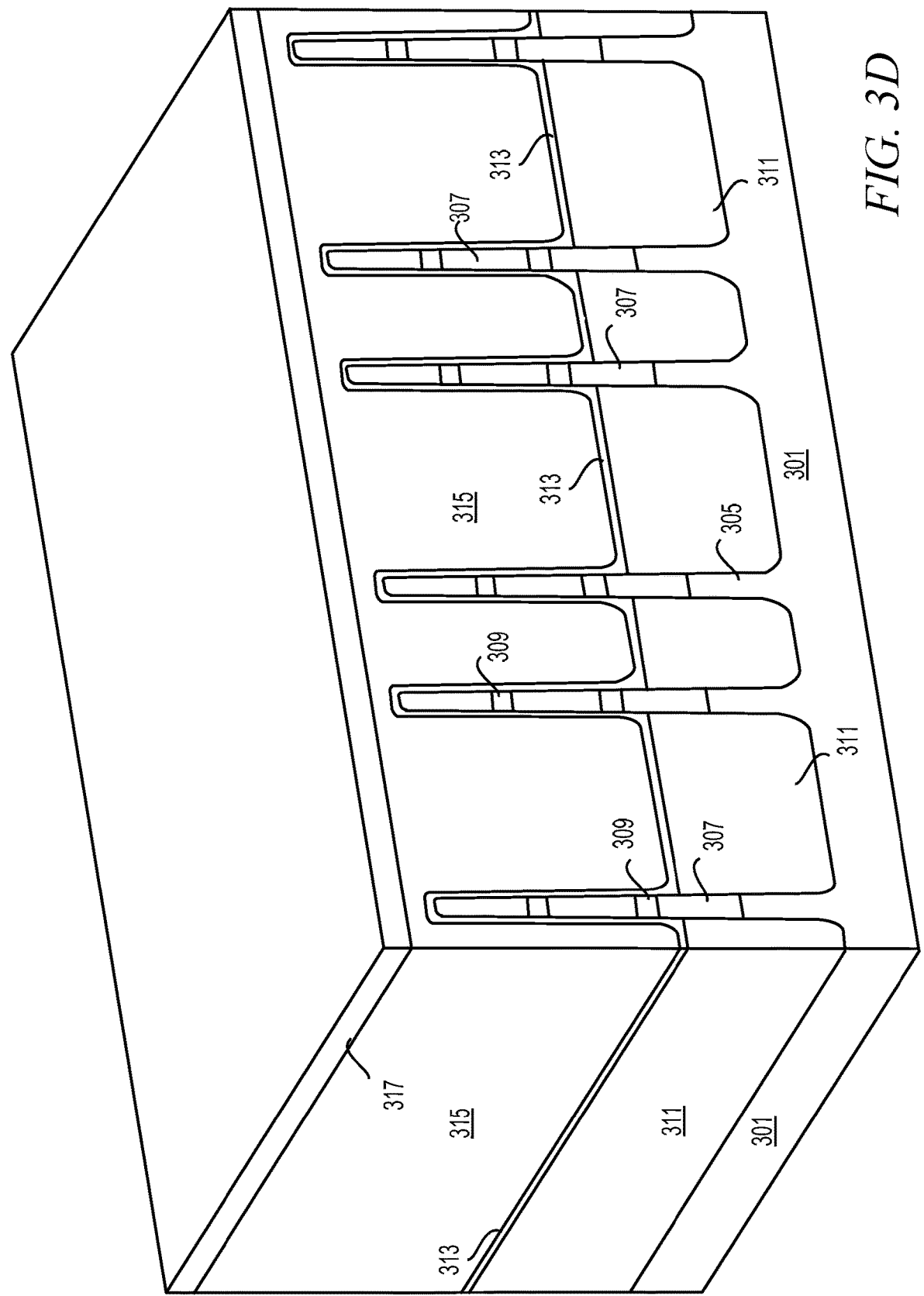
FIG. 3D is a perspective cross-section view of an example intermediate structure in a process of manufacturing the device of FIG. 1 according to certain aspects of the present disclosure.
Figure 3E:
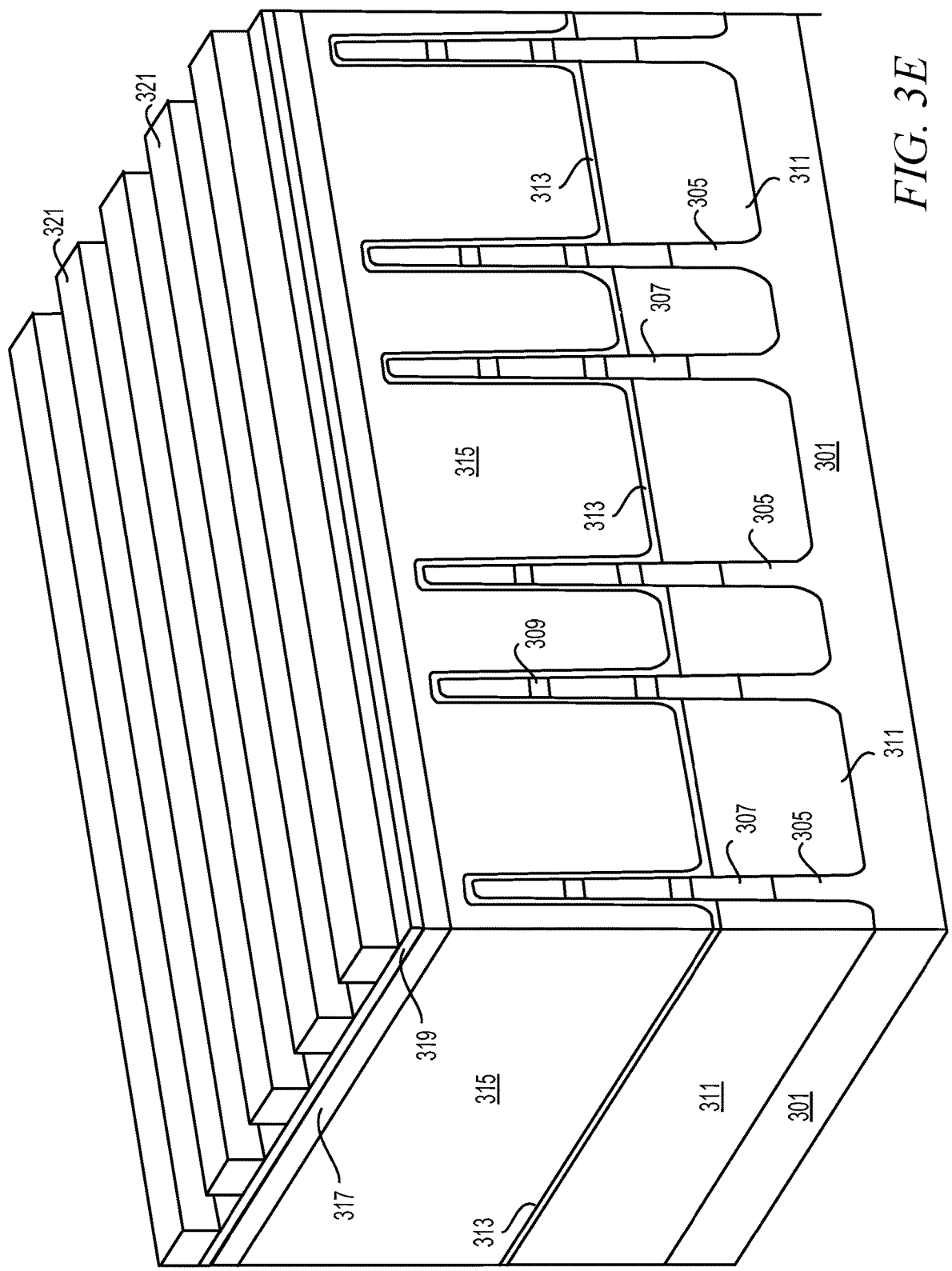
FIG. 3E is a perspective cross-section view of an example intermediate structure in a process of manufacturing the device of FIG. 1 according to certain aspects of the present disclosure.
Figure 3F:
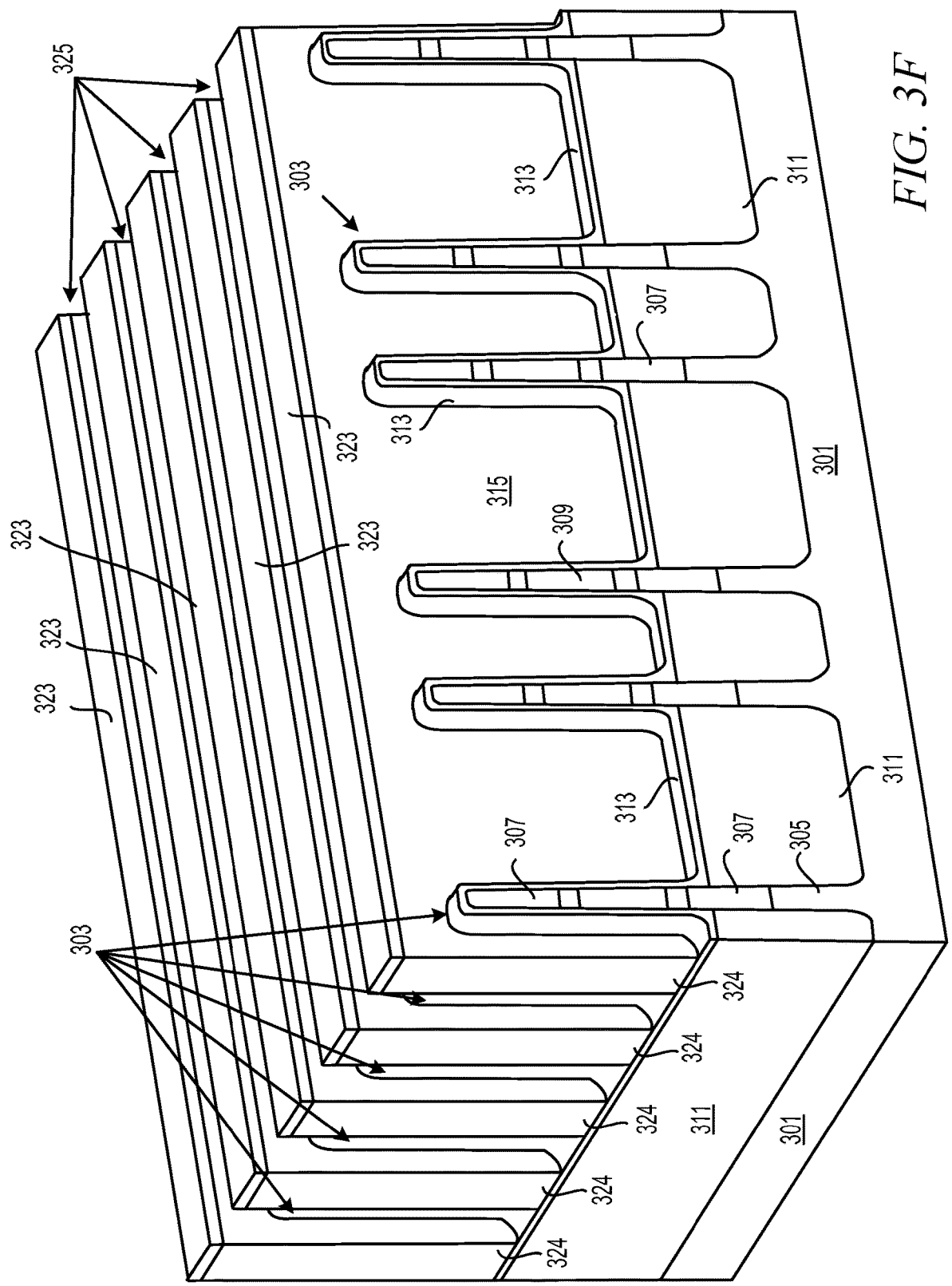
FIG. 3F is a perspective cross-section view of an example intermediate structure in a process of manufacturing the device of FIG. 1 according to certain aspects of the present disclosure.

Returning to FIG. 2, in step 203 a dummy gate is formed over the layered fin structure. In forming the dummy gate, sacrificial, temporary, dummy gate material is deposited on the substrate 301 as seen in FIG. 3D. The dummy gate material 317 can have selectivity to some or all other films used in the nanowire gate spacer and replacement gate open process discussed below. The dummy gate material 317 is then gate patterned, which can be executed with photoresist via self-aligned double patterning (SADP), self-aligned quad patterning (SAQP), anti-spacer processing, or directly by EUV lithography. As seen in FIG. 3E, in one embodiment, photoresist 319 is formed over the dummy gate material 317, and mask 321 defines exposure regions for the photoresist 319. A gate pattern formed by photolithography, for example, is transferred through the dummy gate material 317 and replacement gate material 315 as shown in FIG. 3F. The structure of FIG. 3F shows the completed dummy gate structure 323 formed from dummy gate material 317. As seen, the dummy gate 323 has opposing edges that define a critical dimension of the dummy gate in a direction extending along a length of the fins 303.

Once the dummy gate is formed, a gate structure is then formed directly under the dummy gate in step 205 of FIG. 2. Returning to FIG. 3F, the dummy gates 323 may serve as a mask to etch the replacement gate material 315 thereby creating initial replacement gate structures 324. As seen in FIG. 3F, sidewalls of the replacement gate structures 324 are aligned with edges of the dummy gates 323. Areas between the dummy gates 323 and replacement gate structures define source-drain regions (or S-D bars) 325 of the device. Thus, FIG. 3F and subsequent figures show a cross section of the fins 303 cut through one of the S-D bars 325. Gate CD at this stage can be comprised of the physical gate (i.e., the metal gate region) CD plus two times a gate spacer CD.

The first relief pattern is transferred through the dummy gate layer 317 and through replacement gate layer 315 while the liner 313 protects the Si/SiGe fin. Thus, fins 303 each extend as a continuous structure through alternating replacement gate structures 324 formed by the dummy gate 323 and S-D regions 325, as seen in FIG. 3F.

Figure 3G:
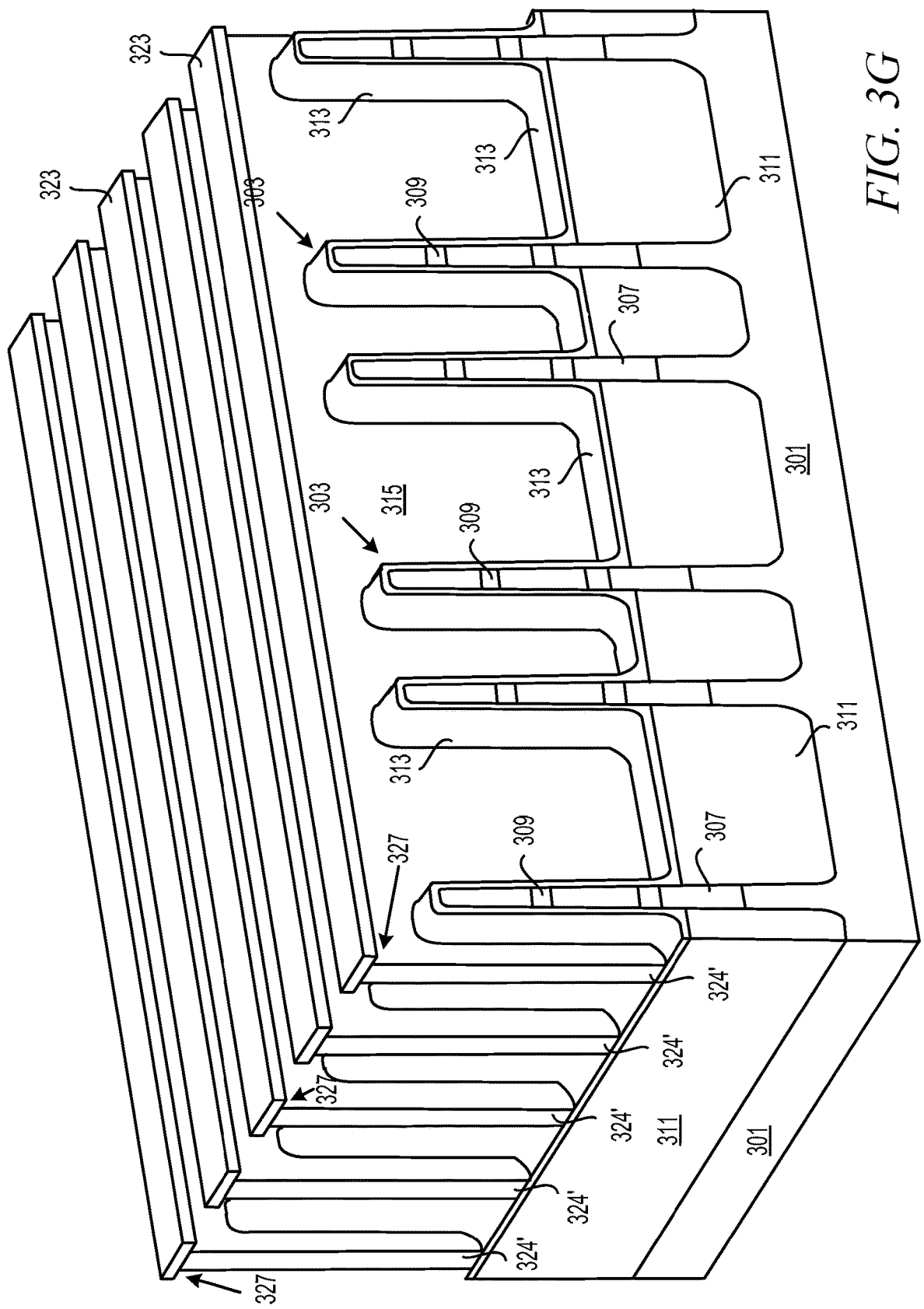
FIG. 3G is a perspective cross-section view of an example intermediate structure in a process of manufacturing the device of FIG. 1 according to certain aspects of the present disclosure.

Sidewalls of the replacement gate structures 324 (e.g., polysilicon) are then selectively laterally recessed under the dummy gate 323. The Si/SiGe fin is protected by the liner 313 which has selectivity to the recess etch. Specifically, as seen in FIG. 3G, the sidewalls of replacement gate material are laterally etched to form a narrowed replacement gate structure 324', thereby forming recesses 327 under dummy gate 323. The recess depth can be defined to be equal to the intended thickness of the gate spacer. The gate spacer thickness may be from 30-100 angstroms. The recess occurs selective to the dummy gate material of dummy gate 323 which is overtop the replacement gate 315. As this lateral etch is isotropic, a depth of the recess can be precisely controlled and is substantially uniform across an area of the sidewalls.—For example, the isotropic etch on the CERTAS tool manufactured by Tokyo electron, Ltd., can be setup such that the etch rate of polysilicon or amorphous silicon can be extremely low; and the etch is setup through a fixed number of cycles in order to provide this precise control. Similarly for an atomic-layer etch type of process, the etch would be self-limiting and also run through a number of fixed cycles, thus enabling the precise control. For what is referred to as quasi-atomic layer etching, it is similar to atomic-layer etching, however the reaction is not self-terminating however the etch process follows a similar mechanism of absorption followed by monolayer etching and again would be setup to a fixed etch duration to enable the precision).

Figure 3H:
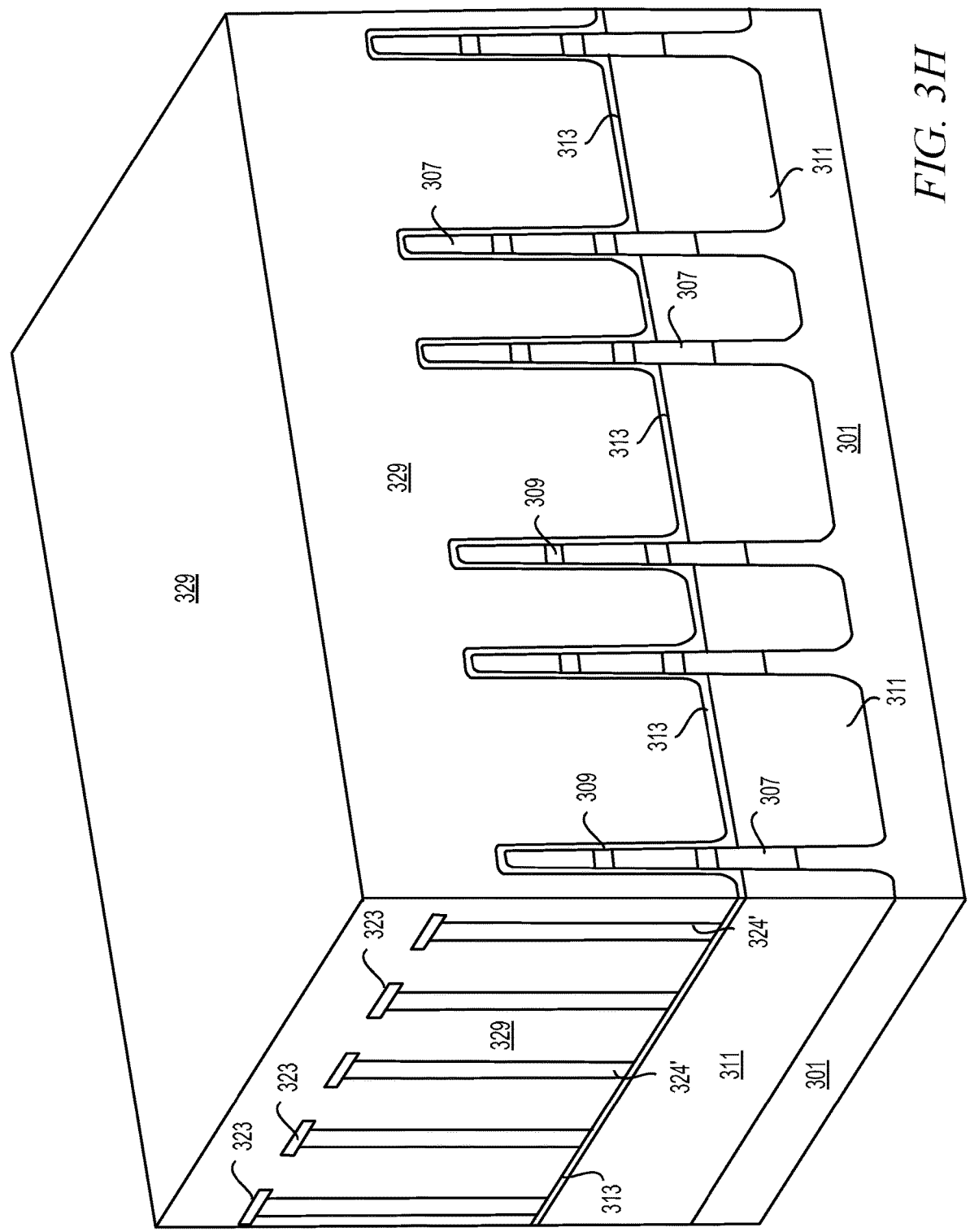
FIG. 3H is a perspective cross-section view of an example intermediate structure in a process of manufacturing the device of FIG. 1 according to certain aspects of the present disclosure.
Figure 3I:
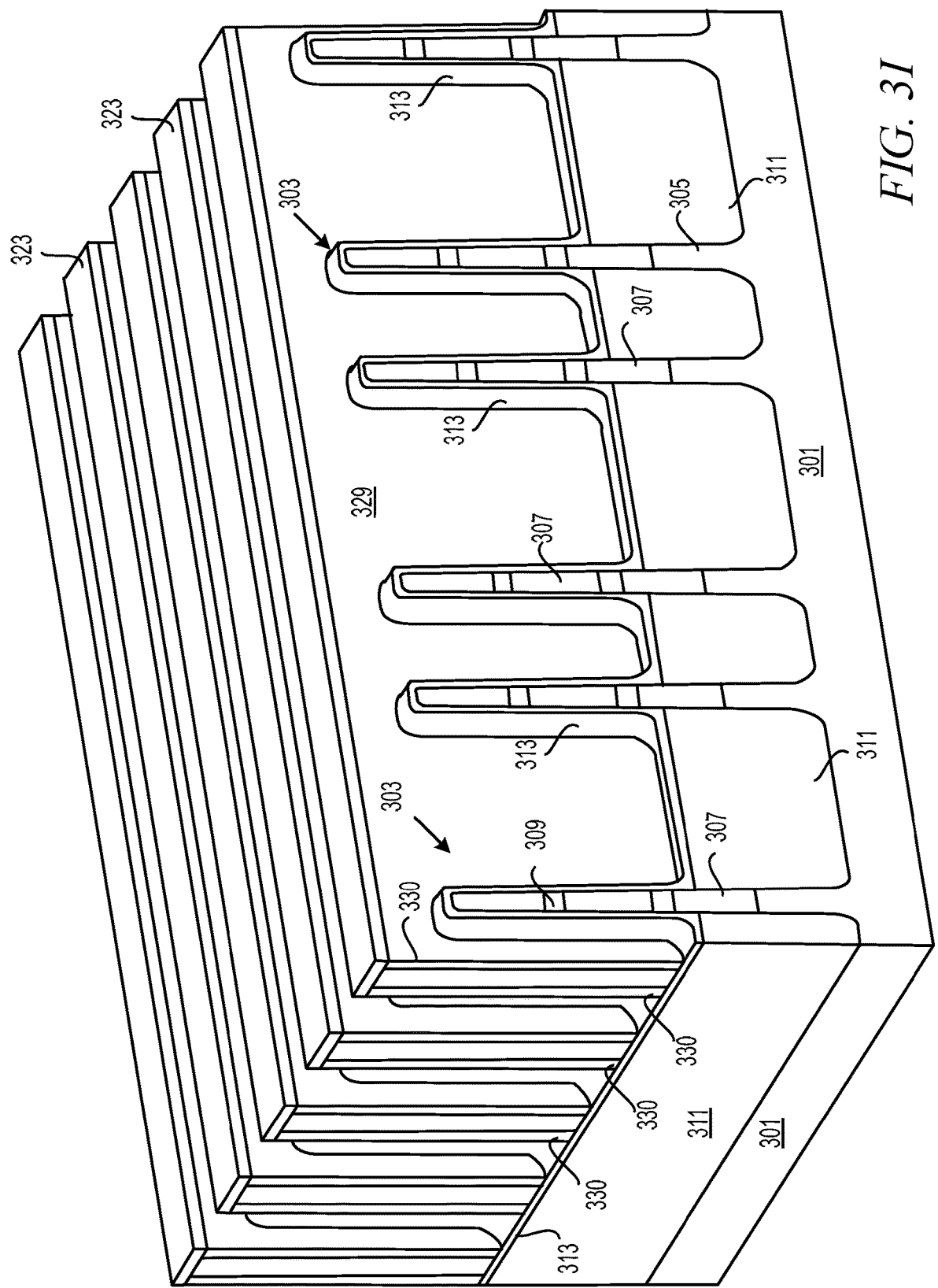
FIG. 3I is a perspective cross-section view of an example intermediate structure in a process of manufacturing the device of FIG. 1 according to certain aspects of the present disclosure.

Gate spacer material is deposited to "fill in" the distance between the edge of the dummy gate 323 and the recessed edge or sidewall of the narrowed replacement gate 324'. In one embodiment, the desired gate spacer material, such as SiN, is deposited on all of the substrate and is overburdened as shown in FIG. 3H. This gate spacer material 329 is then anisotropically etched using the edges of the dummy gate 323 to define how much of the gate spacer material 329 is protected and "filled in" to form the eventual gate spacer. A result of this anisotropic etch is shown in FIG. 3I, where an initial gate spacer structure 330 is now formed from gate spacer material 329.

Figure 3J:
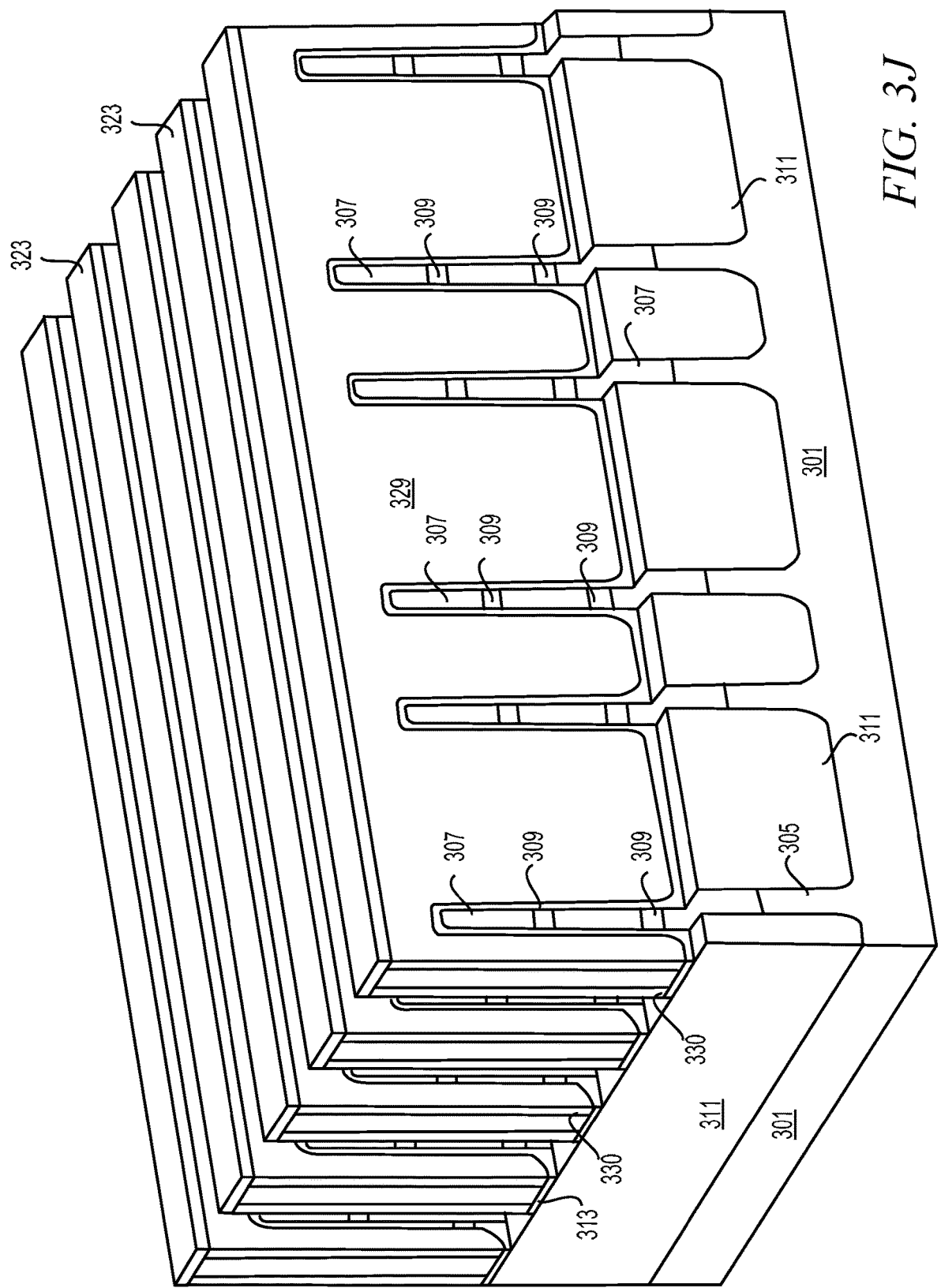
FIG. 3J is a perspective cross-section view of an example intermediate structure in a process of manufacturing the device of FIG. 1 according to certain aspects of the present disclosure.

Next, multilayer fins 303 are cut to define nanowire channels of the FET devices. Specifically, liner 313 protecting the Si/SiGe fins 303 is removed from the substrate, and the Si/SiGe fin 303 is anisotropically etched in order to clear the fin within the S-D bar regions 325. As seen in FIG. 3J, this results in the Si 307 and SiGe 309 layers of the fins 303 having sidewalls facing the S-D bar openings 325 (i.e. the region outside of the metal gate region and the intended gate spacer region).

Figure 3K:
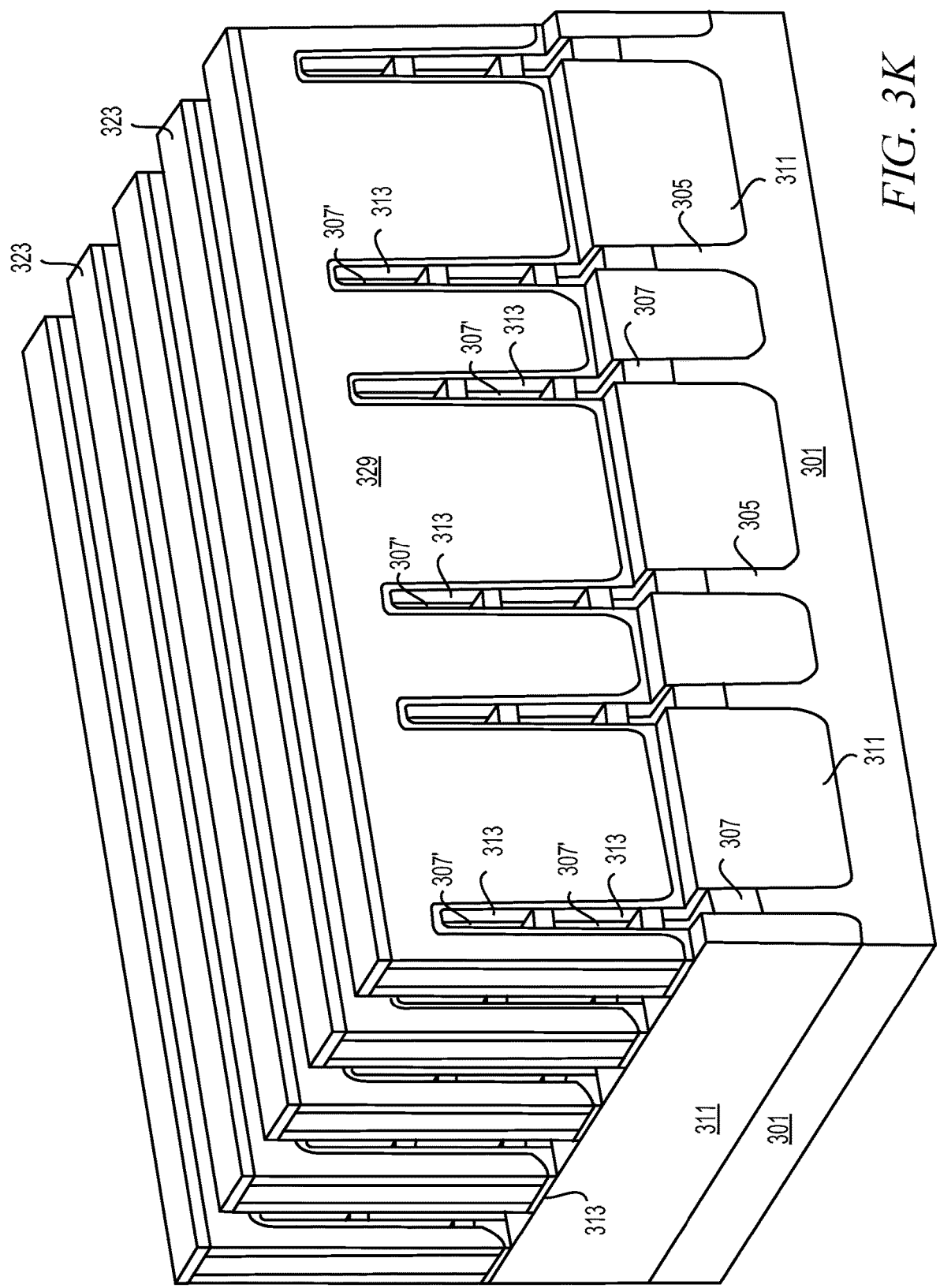
FIG. 3K is a perspective cross-section view of an example intermediate structure in a process of manufacturing the device of FIG. 1 according to certain aspects of the present disclosure.

Sidewall surfaces of the SiGe 307 of the fins 303 are then recessed within the gate spacer structure 329 to a depth of the intended gate spacer, or slightly less than the thickness of the gate spacer. The resulting structure is shown in FIG. 3K where recessed SiGe portions 307' are bordered by liner material 313. A portion of the lower most SiGe layer 307 may also be recessed into the STI material by this process.

Figure 3L:
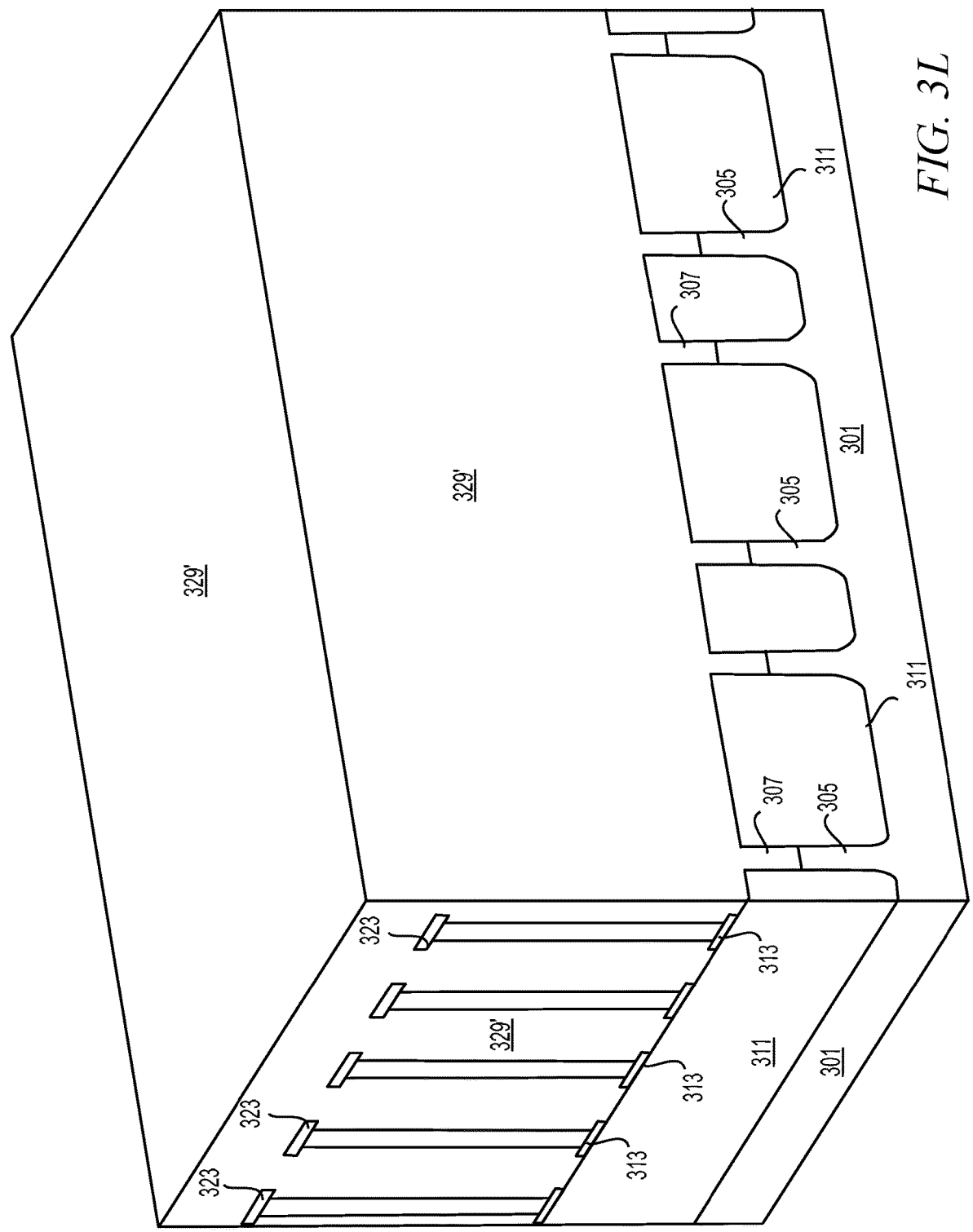
FIG. 3L is a perspective cross-section view of an example intermediate structure in a process of manufacturing the device of FIG. 1 according to certain aspects of the present disclosure.
Figure 3M:
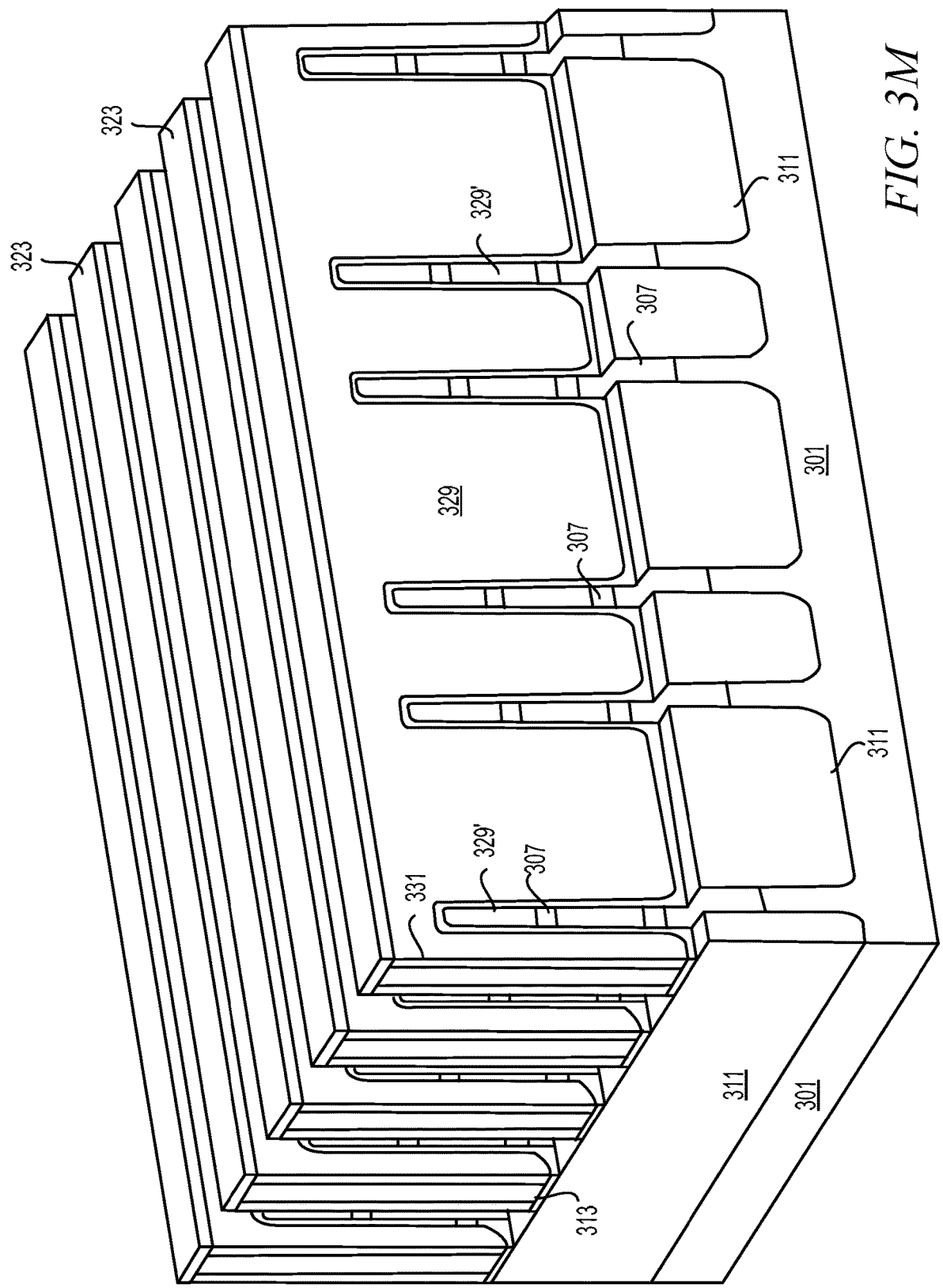
FIG. 3M is a perspective cross-section view of an example intermediate structure in a process of manufacturing the device of FIG. 1 according to certain aspects of the present disclosure.

The intended gate spacer material, such as SiN, is then filled into the recessed SiGe portions 307' to form a completed gate spacer. In one embodiment, additional gate spacer material 329' is deposited over all of the substrate 301 to fill in the recessed areas left by the recessed SiGe, as seen in FIG. 3L. The intended gate spacer material 329' is then anisotropically etched with edge again defined by the dummy gate 323. As shown in FIG. 3M, this completes formation of the gate structure 331, which is formed of the initial gate spacer material 329, and additional gate space material 329'.

Figure 4:
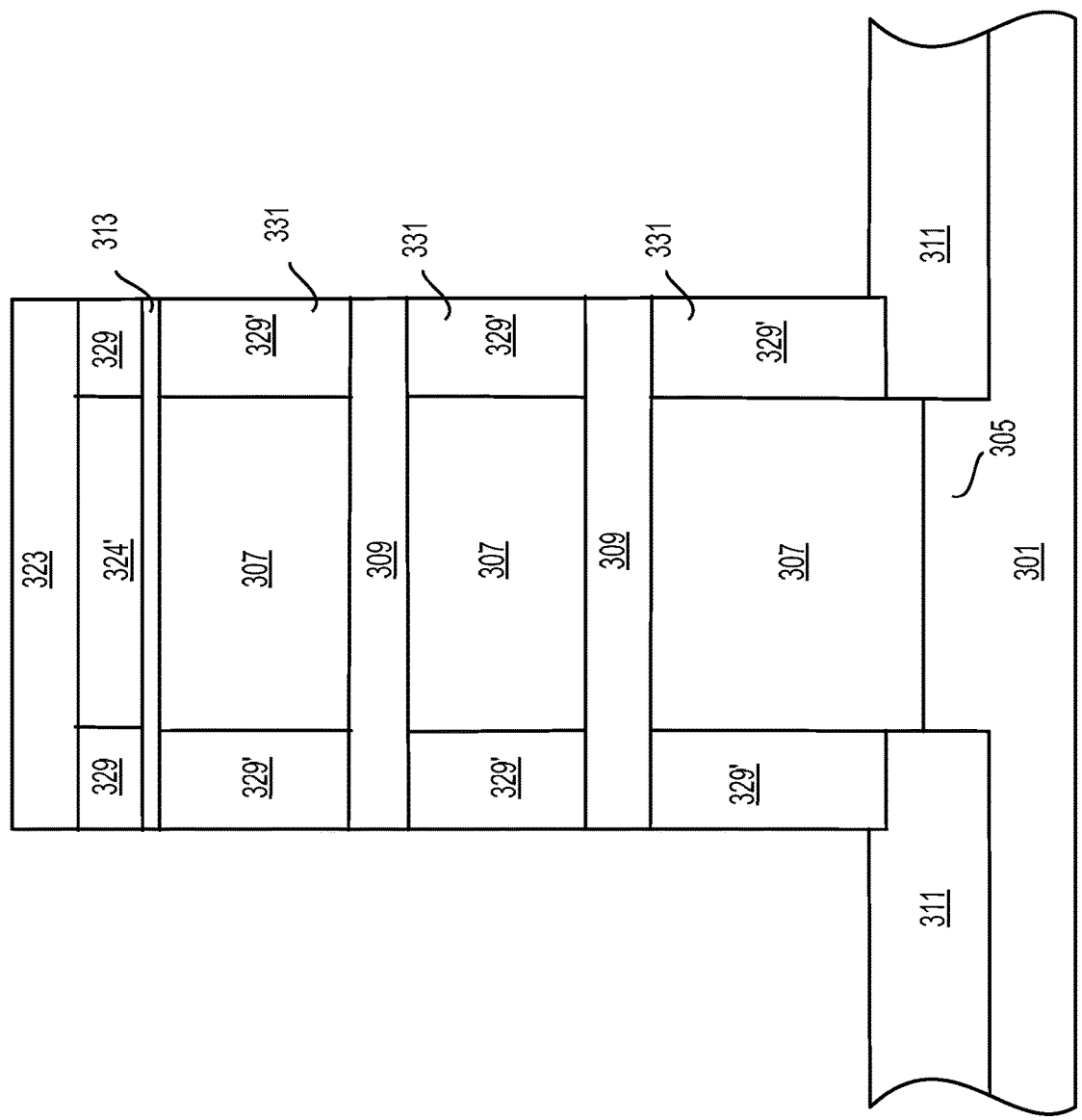
FIG. 4 is a perspective cross-section view of a structure of FIG. 3M.

FIG. 4 shows a cross-section through one of the layered fin structures 303 of FIG. 3M. As seen in FIG. 4, the structure includes the alternating SiGe 307 and Si layers 309 of the original fin structure 303. The SiGe layers 307 are recessed within the gate structure, and gate spacers material 329' fills this recess such that continuous gate spacers 331 surround opposing ends of the nanowires 309. As seen, liner 313, replacement gate material 315 and gate spacer material 329 remain under the dummy gate 323. Outer sidewalls of gate spacers 331 and sidewalls of nanowires 309 are aligned with opposing edges of the dummy gate 323. The liner 313, replacement gate 315, gate spacer material 329' and dummy gate 323 may be subsequently removed, and the SiGe material 307 removed and replaced with a layered metal gate region to provide the device of FIG. 2.

Thus, embodiments of the disclosed invention enable the formation of a gate spacer within recessed areas that expose nanowires. Gate spacer CD control is obtained through an etch process where the edges or sidewalls of the gate spacers are defined by a dummy gate edge on one end and a recess depth of either the silicon or silicon/germanium sacrificial material on the other end. This method provides a "fill-in" process to define the gate spacer which is much more well-controlled, compared to conventional processing methods, to produce a continuous gate spacer around protruding wires. The process effectively produces silicon nanowires extending through the entire gate spacer.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed:

1. A method of forming a gate-all-around semiconductor device, comprising:
   providing a substrate having a channel portion extending in a horizontal direction, and replacement material surrounding the channel portion;
   forming an etch mask above the channel portion, wherein the etch mask has a critical dimension having a width that extends in said horizontal direction; and
   laterally recessing, in said horizontal direction, said replacement material surrounding the channel portion under ends of the etch mask in said horizontal direction to form recessed portions;
   filling said recessed portions with a gate spacer material directly under said ends of the etch mask to form spacers, wherein said spacers are provided on opposing sides of the channel portion, and a total critical dimension of the channel portions and spacers is equal to the critical dimension of said etch mask.

2. The method of claim 1, wherein providing said substrate comprises providing a layered fin structure having the channel portion comprising an Si channel portion and the replacement material comprising an SiGe sacrificial portion.

3. The method of claim 2, wherein said Si channel portion comprises a plurality of Si layers and said SiGe sacrificial portion comprises a plurality of SiGe layers, said Si layers being alternately stacked with said SiGe layers.

4. A method of forming a gate-all-around semiconductor device, comprising:
   providing a substrate having a layered fin structure thereon, the layered fin structure comprising a channel portion and a sacrificial portion each extending along a length of the layered fin structure, wherein the layered fin structure being covered with replacement gate material;
   forming a dummy gate on said replacement gate material over said layered fin structure, wherein the dummy gate having a critical dimension which extends along said length of the layered fin structure; and
   forming a gate structure directly under said dummy gate, said gate structure comprising a metal gate region and gate spacers provided on opposing sides of the metal gate region, wherein said gate spacers are formed by etching said replacement gate material under ends of said dummy gate to form lateral recesses in opposing sidewall surfaces of the layered fin structure and then filling the lateral recesses with a gate spacer material.

5. The method of claim 4, wherein providing said substrate comprises providing a layered fin structure having an Si channel portion and an SiGe sacrificial portion.

6. The method of claim 5, wherein said Si channel portion comprises a plurality of Si layers and said SiGe sacrificial portion comprises a plurality of SiGe layers, said Si layers being alternately stacked with said SiGe layers.

7. The method of claim 4, wherein a total critical dimension of the gate structure is equal to the critical dimension of said dummy gate.

8. The method of claim 7, wherein said forming the dummy gate comprises:
   forming a layer of dummy gate material on said replacement gate material;
   removing a portion of the dummy gate material such that a remaining portion of the dummy gate material has opposing edges defining said dummy gate having said critical dimension.

9. The method of claim 8, wherein said forming the gate structure comprises using the dummy gate as a mask to anisotropically etch said replacement gate material such that opposing sidewall surfaces of the replacement gate material are aligned with said opposing edges of said dummy gate.

10. A gate all around nanowire FET device comprising:
   at least one nanowire having opposing ends;
   a gate structure comprising a metal gate region surrounding a middle portion of the at least one nanowire, and gate spacers surrounding remaining end portions of the at least one nanowire to form opposing sidewalls of the gate structure, wherein the gate structure is coextensive with the at least one nanowire in a direction running from one of the opposing sidewalls to another of the opposing sidewalls, and the opposing ends of the at least one nanowire are level with the opposing sidewalls of the gate structure; and
   source-drain regions provided on said opposing sidewalls of the gate structure.

11. The gate all around nanowire FET device of claim 10, wherein said at least one nanowire comprises a plurality of vertically stacked nanowires, wherein each nanowire is coextensive with said gate structure.

12. The gate all around nanowire FET device of claim 10, wherein said at least one nanowire is made of a material selected from Si and SiGe.

* * * * *